(12) United States Patent
Nakatani et al.

(10) Patent No.: US 8,723,279 B2
(45) Date of Patent: May 13, 2014

(54) MEMS SENSOR, AND MEMS SENSOR MANUFACTURING METHOD

(75) Inventors: Goro Nakatani, Kyoto (JP); Mizuho Okada, Kyoto (JP); Nobuhisa Yamashita, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 469 days.

(21) Appl. No.: 12/670,406

(22) PCT Filed: Jul. 22, 2008

(86) PCT No.: PCT/JP2008/063134
§ 371 (c)(1),
(2), (4) Date: Jan. 24, 2010

(87) PCT Pub. No.: WO2009/014118
PCT Pub. Date: Jan. 29, 2009

(65) Prior Publication Data
US 2010/0193886 A1  Aug. 5, 2010

(30) Foreign Application Priority Data

Jul. 24, 2007 (JP) ................................ 2007-192201
Jul. 24, 2007 (JP) ................................ 2007-192205
Jul. 24, 2007 (JP) ................................ 2007-192206

(51) Int. Cl.
*H01L 29/84* (2006.01)
(52) U.S. Cl.
USPC ............. 257/416; 257/E29.324; 257/E21.158

(58) Field of Classification Search
USPC .......................... 257/416, E29.324, E21.158
See application file for complete search history.

(56) References Cited

U.S. PATENT DOCUMENTS 5,870,482 A      2/1999  Loeppert et al.
2007/0261910 A1  11/2007 Kasai et al.

FOREIGN PATENT DOCUMENTS

| JP | 2001-518246 |   | 10/2001 |
| JP | 2006-157863 | A | 6/2006 |
| JP | 2007-124306 | A | 5/2007 |
| JP | 2007-142663 | A | 6/2007 |
| JP | 2008-113057 | A | 5/2008 |
| WO | WO-2006-025211 | A1 | 3/2006 |

*Primary Examiner* — Long Pham
(74) *Attorney, Agent, or Firm* — Rabin & Berdo, P.C.

(57) ABSTRACT

MEMS sensor including substrate, lower thin film confronting one face of the substrate with a space therebetween and having lower through holes extending in the thickness direction thereof, and upper thin film arranged on the opposite side of the substrate confronting the lower thin film with a space therebetween and having upper through holes extending in the thickness direction. A MEMS sensor manufacturing method includes forming a first sacrificing layer on one face of a substrate, forming a lower thin film on the first sacrificing layer with lower through holes individually extending in the thickness direction, forming a second sacrificing layer on the lower thin film, forming an upper thin film on the second sacrificing layer with upper through holes individually extending in the thickness direction, removing the second sacrificing layer through the upper through holes by etching, and removing the first sacrificing layer through the upper and lower through holes by etching.

13 Claims, 20 Drawing Sheets

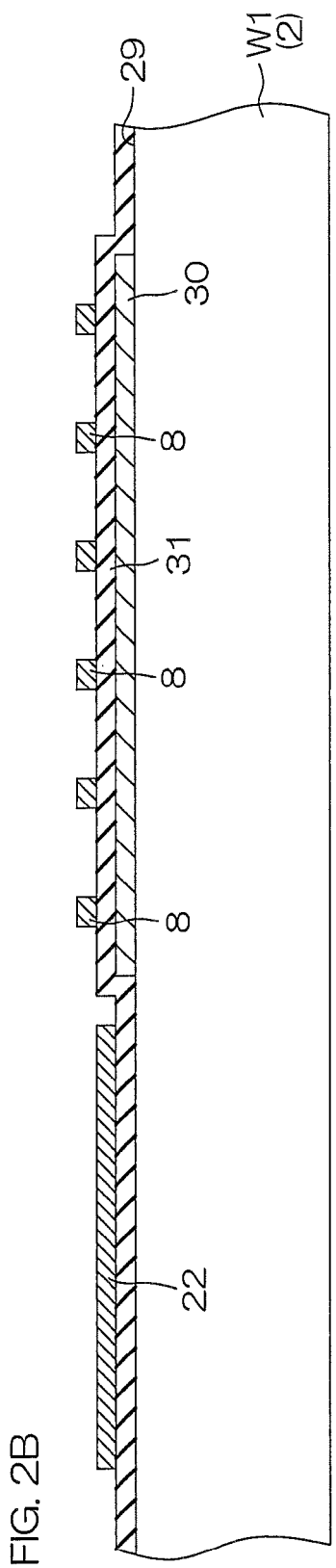

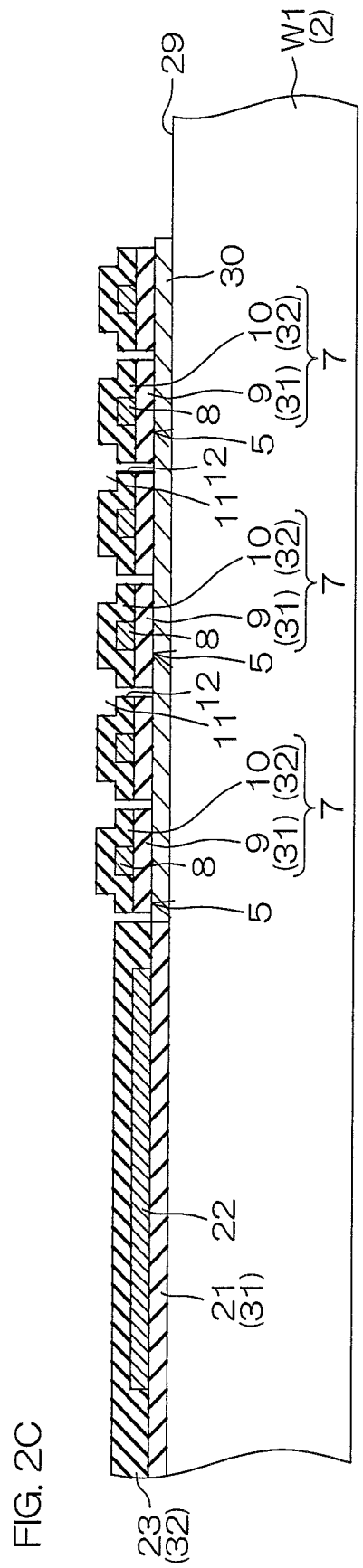

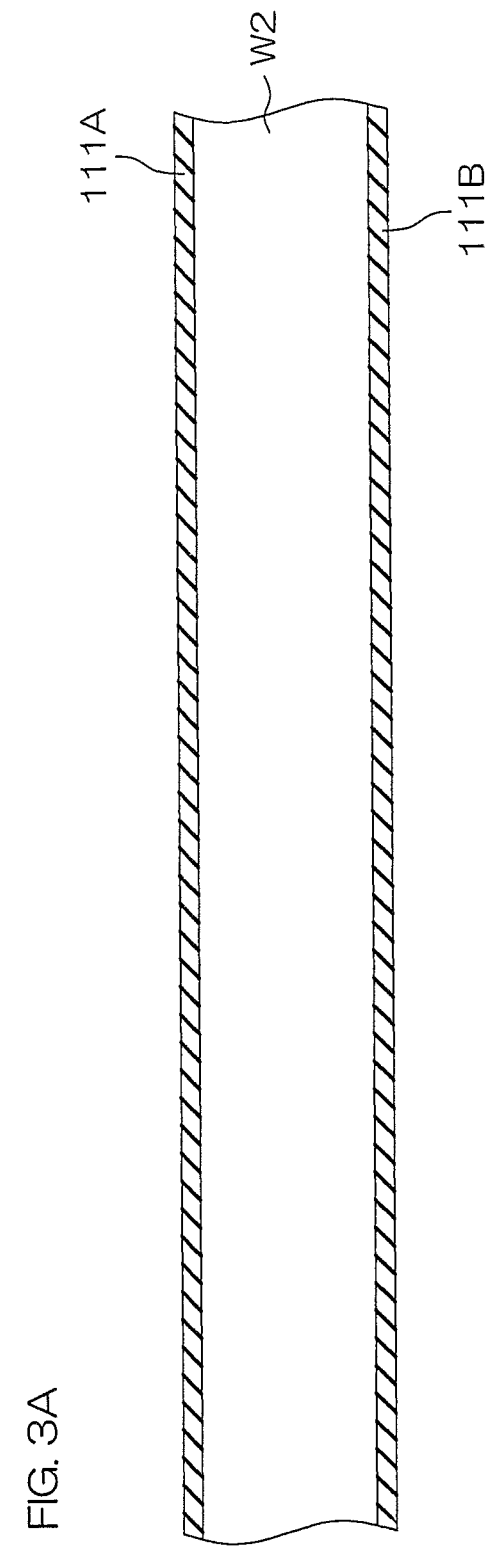

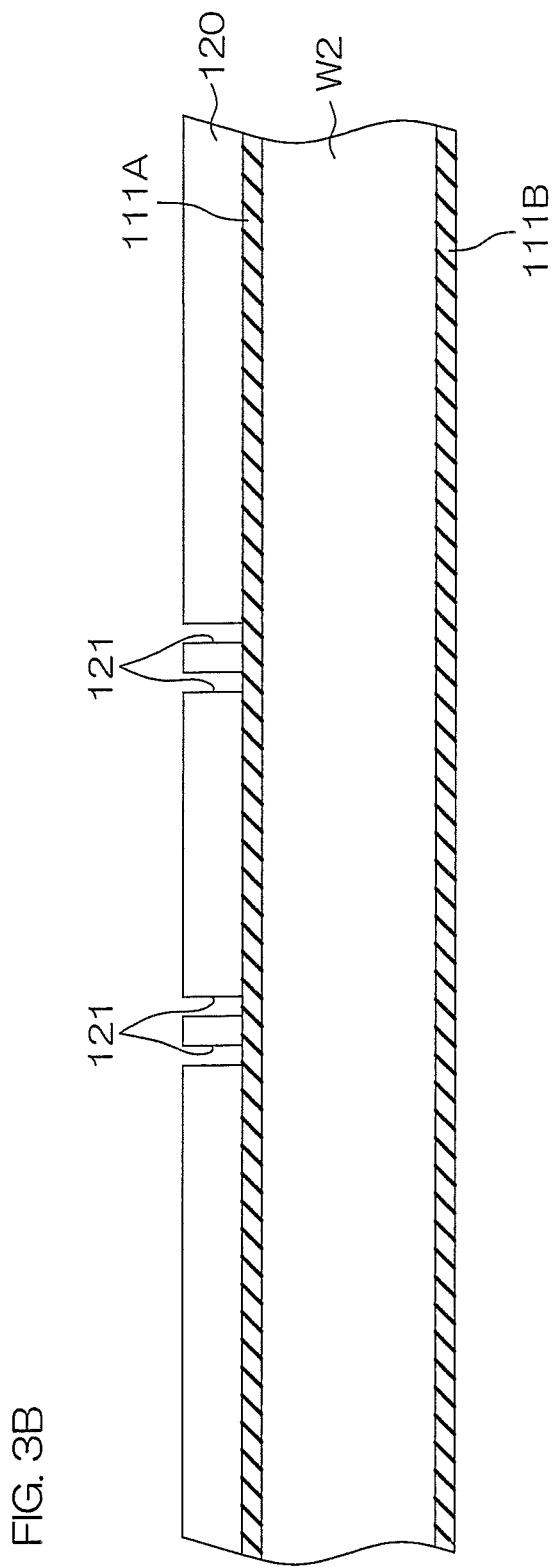

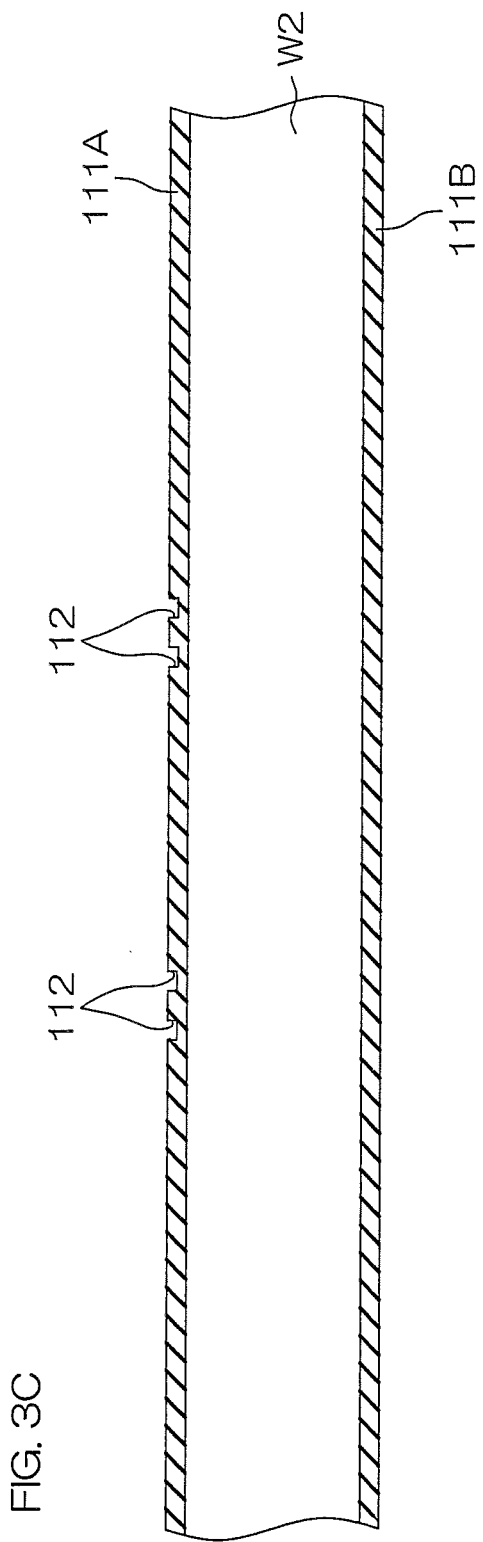

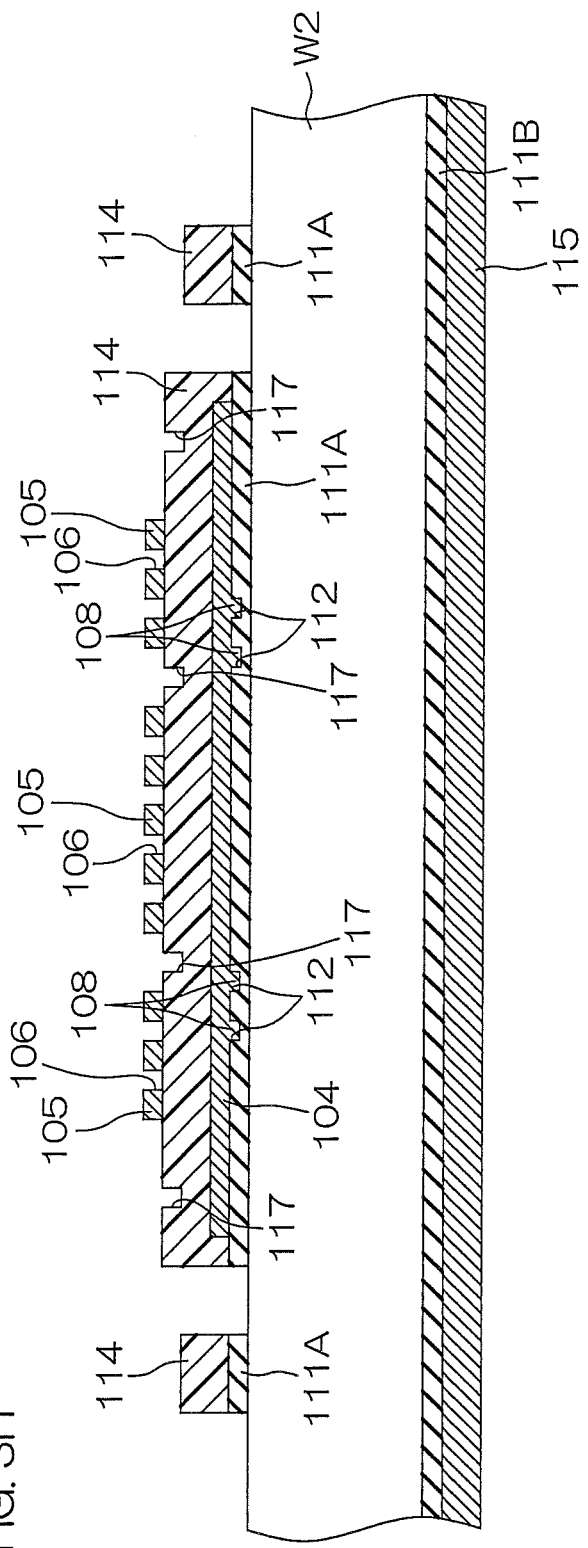

MEMS SENSOR, AND MEMS SENSOR MANUFACTURING METHOD

TECHNICAL FIELD

The present invention relates to an MEMS sensor and a manufacturing method therefor.

PRIOR ART

An MEMS sensor such as an Si (silicon) microphone manufactured by the MEMS (Micro Electro Mechanical Systems) technique has recently been employed as a microphone loaded on a portable telephone or the like.

FIGS. 3A to 3K are schematic sectional views showing a manufacturing method for a conventional Si microphone in step order. The manufacturing method for the conventional Si microphone as well as the structure thereof are described with reference to FIGS. 3A to 3K.

In order to manufacture a conventional Si microphone 101, $SiO_2$ (silicon oxide) films 111 (111A formed on the upper surface side of an Si wafer W2 and 111B formed on the lower surface side) are first formed on the overall surfaces of the Si wafer W2 by thermal oxidation, as shown in FIG. 3A.

Then, a photoresist film 120 having holes 121 of a prescribed pattern is formed on the upper surface of the $SiO_2$ film 111A, as shown in FIG. 3B. The $SiO_2$ film 111A is etched through the photoresist film 120 serving as a mask, whereby a plurality of (four in FIG. 3C) recesses 112 are formed on the upper surface of the $SiO_2$ film 111A, as shown in FIG. 3C. After the formation of the recesses 112, the photoresist film 120 is removed.

Then, polysilicon is deposited on the overall surfaces of the $SiO_2$ films 111 by LPCVD (Low Pressure Chemical Vapor Deposition). The polysilicon film covering the overall region of the upper surface of the $SiO_2$ film 111A is doped with phosphorus, and portions other than the portion present on a prescribed region including the plurality of recesses 112 are thereafter removed by well-known photolithography and etching. Thus, a thin-film polysilicon plate 104 is formed on the prescribed region of the $SiO_2$ film 111A, as shown in FIG. 3D. Further, a polysilicon film 113 is formed on the $SiO_2$ film 111B.

Then, $SiO_2$ is deposited on the overall surfaces of the $SiO_2$ film 111A and the polysilicon plate 104 by PECVD (Plasma Enhanced Chemical Vapor Deposition). Then, unnecessary portions of $SiO_2$ are removed by well-known photolithography and etching. Thus, a sacrificial layer 114 is formed on the polysilicon plate 104 and peripheral regions thereof, as shown in FIG. 3E.

Then, polysilicon is deposited on the $SiO_2$ film 111A, the sacrificial layer 114 and the polysilicon film 113 by LPCVD. Thus, the polysilicon deposited on the polysilicon film 113 and the polysilicon film 113 are integrated into a polysilicon film 115, as shown in FIG. 3F. On the other hand, the polysilicon deposited on the $SiO_2$ film 111A and the sacrificial layer 114 is doped with phosphorus, and thereafter patterned by well-known photolithography and etching. Thus, a back plate 105 having a large number of holes 106 is formed on the sacrificial layer 114, as shown in FIG. 3F.

Then, a photoresist film 122 having holes 123 of a prescribed pattern is formed on the overall region of the upper portion of the sacrificial layer 114 including the back plate 105, as shown in FIG. 3G. The sacrificial layer 114 is etched through the photoresist film 122 serving as a mask. Thus, a plurality of (four in FIG. 3G) recesses 117 are formed on the upper surface of the sacrificial layer 114 while unnecessary portions (portions other than the portion opposed to the sacrificial layer 114) of the $SiO_2$ film 111A are removed, as shown in FIG. 3H. After the formation of the recesses 117, the photoresist film 122 is removed.

Then, the polysilicon film 115 is removed, and a SiN (silicon nitride) film 107 is formed on a region of the upper surface side of the Si wafer W2 by PECVD, as shown in FIG. 3I.

Then, holes 118 communicating with the respective holes 106 of the back plate 105 are formed in the SiN film 107 by well-known photolithography and etching, as shown in FIG. 3J. Thus, the sacrificial layer 114 is partially exposed through the holes 106 and 118. Further, an opening is formed in a portion of the $SiO_2$ film 111B opposed to the polysilicon plate 104 by well-known photolithography and etching. The Si wafer W2 is etched through the opening, whereby a through-hole 103 is formed in the Si wafer W2. As a result, the $SiO_2$ film 111A is partially exposed through the through-hole 103.

Then, an etching solution capable of etching $SiO_2$ is supplied from the through-hole 103 and the holes 106 and 118, whereby the sacrificial layer 114 and the $SiO_2$ film 111A are wet-etched. Thus, the polysilicon plate 104 floats up from the upper surface of the Si wafer W2 while a cavity 110 of a small interval is formed between the polysilicon plate 104 and the back plate 105, as shown in FIG. 3K.

Thereafter the Si wafer W2 is divided into each Si substrate 102 of a device size, whereby the Si microphone 101, in which the polysilicon plate 104 and the back plate 105 are opposed to each other through the cavity 110, is obtained. Portions of the SiN film 107 having entered the respective recesses 117 of the sacrificial layer 114 form projections 109 protruding toward the polysilicon plate 104, and function as stoppers for preventing adhesion and a short circuit between the polysilicon plate 104 and the back plate 105. Further, portions of the polysilicon plate 104 having entered the respective recesses 112 of the $SiO_2$ film 111A form projections 108 protruding toward the upper surface of the Si wafer W2, and function as stoppers for preventing adhesion between the Si substrate 102 and the polysilicon plate 104. The polysilicon plate 104 and the back plate 105 are supported by unshown wires.

In the Si microphone 101, the polysilicon plate 104 and the back plate 105 form capacitors opposed to each other through the cavity 110. When a sound pressure (a sound wave) is input into the Si microphone 101 from above the back plate 105, the polysilicon plate 104 vibrates due to the sound pressure, and an electric signal responsive to changes in the capacitances of the capacitors resulting from the vibration of the polysilicon plate 104 is output.

Patent Document 1: National Patent Publication Gazette No. 2001-518246

DISCLOSURE OF THE INVENTION

Problems to be Solved

In the manufacturing method for the conventional Si microphone 101, the through-hole 103 is formed in the Si wafer W2 and the wet etching is performed also from the through-hole 103, in order to remove the $SiO_2$ film 111A between the Si wafer W2 and the platelike polysilicon plate 104 in a short time.

When the sacrificial layer 114 is entirely removed by the etching solution supplied from the holes 106 and 118, the etching solution spreads downward from side portions of the polysilicon plate 104, whereby the $SiO_2$ film 111A under the polysilicon plate 104 can be removed with the etching solution. According to this technique, however, it takes time to completely remove the SiO$_2$ film 111A.

In the manufacturing method for the conventional Si microphone 101, therefore, the through-hole 103 is formed in the Si wafer W2, and the etching solution is supplied from the through-hole 103 and the holes 106 and 118, for progressing the etching of the SiO$_2$ film 111A in parallel with the etching of the sacrificial layer 114. Thus, the time required for removing the sacrificial layer 114 and the SiO$_2$ film 111A is reduced. In order to form the through-hole 103 in the Si wafer W2, however, the opening must be formed in the SiO$_2$ film 111B on the lower surface of the Si wafer W2, and the Si wafer W2 must be etched from the opening. In other words, two steps including the step of forming the opening in the SiO$_2$ film 111B and the step of etching the Si wafer W2 must inevitably be added. Even if the technique is employed, therefore, it takes time and labor to manufacture the Si microphone 101 as a result.

An object of the present invention is to provide an MEMS sensor capable of reducing the time and labor required for manufacturing the same and a manufacturing method therefor.

Solutions to the Problems

The MEMS sensor according to the present invention includes a substrate, a lower thin film opposed to one surface of the substrate at an interval and provided with a plurality of lower through-holes formed to pass through the same in the thickness direction thereof, and an upper thin film opposed to the lower thin film at an interval on a side opposite to the substrate and provided with a plurality of upper through-holes formed to pass through the same in the thickness direction thereof.

The MEMS sensor manufacturing method according to the present invention includes the steps of forming a first sacrificial layer on one surface of a substrate, forming a lower thin film having a plurality of lower through-holes extending in the thickness direction respectively on the first sacrificial layer, forming a second sacrificial layer on the lower thin film, forming an upper thin film having a plurality of upper through-holes extending in the thickness direction respectively on the second sacrificial layer, removing the second sacrificial layer through the upper through-holes by etching, and removing the first sacrificial layer through the upper through-holes and the lower through-holes by etching.

The MEMS sensor according to the present invention can be prepared by the MEMS sensor manufacturing method according to the present invention, for example.

According to the manufacturing method, the first sacrificial layer is formed on one surface of the substrate. The lower thin film having the plurality of lower through-holes extending in the thickness direction respectively is formed on the first sacrificial layer. The second sacrificial layer is formed on the lower thin film. The upper thin film having the plurality of upper through-holes extending in the thickness direction respectively is formed on the second sacrificial layer. The second sacrificial layer is removed through the upper through-holes by etching. The first sacrificial layer is removed through the upper through-holes and the lower through-holes by etching after the removal of the second sacrificial layer.

The lower thin film has the plurality of lower through-holes, whereby an etching solution or etching gas can be promptly supplied to the first sacrificial layer under the lower thin film through the lower through-holes. Therefore, the first sacrificial layer can be removed in a short time without forming a through-hole exposing the first sacrificial layer from another surface of the substrate in the substrate and supplying the etching solution or etching gas to the first sacrificial layer through the through-hole. Consequently, the time and labor required for manufacturing the MEMS sensor can be reduced.

In the MEMS sensor, the plurality of upper through-holes are preferably arranged on positions deviating from the lower through-holes in plan view respectively.

The MEMS sensor can be prepared by a manufacturing method including the steps of forming a first sacrificial layer made of silicon nitride on one surface of a substrate, forming a lower thin film having a plurality of lower through-holes extending in the thickness direction respectively on the first sacrificial layer, forming a second sacrificial layer made of silicon nitride on the lower thin film, forming an upper thin film having a plurality of upper through-holes extending in the thickness direction respectively on positions deviating from the lower through-holes in plan view on the second sacrificial layer, removing the second sacrificial layer through the upper through-holes by etching, and removing the first sacrificial layer through the upper through-holes and the lower through-holes by etching, for example.

If the upper through-holes and the lower through-holes are arranged on the same positions in plan view, the etching solution or etching gas supplied from the upper through-holes is hard to supply to portions of the second sacrificial layer not opposed to the upper through-holes and the lower through-holes. Therefore, the second sacrificial layer may remain on the portions unless the time for supplying the etching solution or etching gas is set sufficiently long.

In the MEMS sensor, on the other hand, the upper through-holes and the lower through-holes are arranged on positions deviating from one another in plan view. After the removal of the second sacrificial layer, therefore, the etching solution or etching gas supplied from the upper through-holes spreads toward the lower through-holes through a cavity between the upper thin film and the lower thin film resulting from the removal of the second sacrificial layer. Therefore, the first sacrificial layer and the second sacrificial layer can be excellently removed without leaving the second sacrificial layer between the upper thin film and the lower thin film. Consequently, the time and labor required for manufacturing the MEMS sensor can be further reduced as compared with the case where the upper through-holes and the lower through-holes are arranged on the same positions in plan view.

The MEMS sensor preferably includes protrusions formed integrally with the upper thin film to protrude toward the lower through-holes from a surface of the upper thin film opposed to the lower thin film.

The MEMS sensor can be prepared by a manufacturing method including the steps of forming a first sacrificial layer made of silicon nitride on one surface of a substrate, forming a lower thin film having a plurality of lower through-holes extending in the thickness direction respectively on the first sacrificial layer, forming a second sacrificial layer made of silicon nitride on the lower thin film, forming an upper thin film having a plurality of upper through-holes extending in the thickness direction respectively on positions deviating from the lower through-holes in plan view on the second sacrificial layer, removing the second sacrificial layer through the upper through-holes by etching, and removing the first sacrificial layer through the upper through-holes and the lower through-holes by etching, for example.

In the Si microphone 101 obtained by the manufacturing method shown in FIGS. 3A to 3K, for example, the thin-film polysilicon plate 104 is easily attracted to the back plate 105 by electrostatic force or the like. When the polysilicon plate 104 and the back plate 105 come into contact with each other, a short circuit is caused therebetween, and the sound pressure cannot be correctly detected. If the attracted polysilicon plate 104 comes into contact with the back plate 105 over a wide contact area, there is a possibility that the contact therebetween is maintained by electrostatic force or the like and the polysilicon plate 104 and the back plate 105 come into close contact with each other.

In the Si microphone 101, therefore, the plurality of projections 109 are formed on the insulating SiN film 107. Thus, when the polysilicon plate 104 is attracted to the back plate 105, the projections 109 come into contact with the back plate 105, so that a short circuit between the polysilicon plate 104 and the back plate 105 as well as adhesion between the polysilicon plate 104 and the back plate 105 can be prevented.

However, the step (see FIG. 3G) of forming the photoresist film 122 having the holes 123 on the sacrificial layer 114 and the step (see FIG. 3H) of forming the recesses 117 in the sacrificial layer 114 by the etching through the photoresist film 122 serving as the mask are required in order to form the projections 109, and it takes time and labor to form the projections 109.

In the MEMS sensor of this structure and the manufacturing method therefor, on the other hand, it is aimed at providing an MEMS sensor capable of reducing the time and labor for forming the protrusions for preventing contact between the upper thin film and the lower thin film.

The lower thin film has the plurality of lower through-holes, whereby a sacrificial layer material (SiN (silicon nitride), aluminum (Al) or $SiO_2$ (silicon oxide), for example) employed as the material for the second sacrificial layer enters the lower through-holes when the second sacrificial layer is formed. Therefore, portions of the sacrificial layer material entering the lower through-holes (portions of the second sacrificial layer opposed to the lower through-holes) are depressed, whereby recesses are formed in the second sacrificial layer. The recesses are so formed in the second sacrificial layer that the upper thin film formed on the second sacrificial layer partially enters the recesses of the second sacrificial layer. Then, the second sacrificial layer is so removed that a cavity is formed between the lower thin film and the upper thin film, and the portions having entered the recesses of the second sacrificial layer form the protrusions protruding toward the lower through-holes.

Thus, in the MEMS sensor and the manufacturing method therefor, the recesses utilized for forming protrusions can be formed in the second sacrificial layer without carrying out a step of forming a photoresist film having a plurality of holes on the second sacrificial layer and a step of forming recesses in the second sacrificial layer by etching through the photoresist film serving as a mask. Consequently, the time and labor required for forming the protrusions can be reduced.

In the MEMS sensor, the lower thin film may include a lower thin film insulating layer and a lower electrode covered with the lower thin film insulating layer.

In the MEMS sensor, the lower thin film insulating layer may include a first insulating layer defining a lower layer and a second insulating layer defining an upper layer formed on the first insulating layer, and the lower electrode may be held between the first insulating layer and the second insulating layer, so that the overall surface thereof is covered with the lower thin film insulating layer.

When the plurality of recesses are formed in the second insulating layer, the lower through-holes may be formed to pass through the lower thin film insulating layer from the bottom surfaces of the respective recesses.

The second insulating layer may swell on portions opposed to the lower electrode, so that the recesses are formed on portions not opposed to the lower electrode.

In the MEMS sensor, the upper thin film may include an upper thin film insulating layer and an upper electrode covered with the upper thin film insulating layer.

In the MEMS sensor, the upper thin film insulating layer may include a third insulating layer defining a lower layer and a fourth insulating layer defining an upper layer formed on the third insulating layer, and the upper electrode may be held between the third insulating layer and the fourth insulating layer, so that the overall surface thereof is covered with the upper thin film insulating layer.

The protrusions may be projections formed integrally with the third insulating layer, and the projections may be formed on portions opposed to the recesses in this case.

In the MEMS manufacturing method, the step of forming the upper thin film preferably includes a step of forming the upper thin film having the plurality of upper through holes on positions deviating from the lower through-holes in plan view.

In the MEMS sensor manufacturing method, the first sacrificial layer and the second sacrificial layer are preferably made of the same material (Al (aluminum), SiN (silicon nitride) or $SiO_2$ (silicon oxide), for example).

When the first sacrificial layer and the second sacrificial layer are made of the same material, the first sacrificial layer can be removed subsequently to the removal of the second sacrificial layer in a series of steps. Consequently, the time and labor required for manufacturing the MEMS sensor can be further reduced.

In the MEMS sensor manufacturing method, the steps of removing the second sacrificial layer and removing the first sacrificial layer are preferably steps of removing the second sacrificial layer and the first sacrificial layer by dry etching.

If the steps of removing the first sacrificial layer and removing the second sacrificial layer are carried out by wet etching, an etching solution is supplied to the first sacrificial layer and the second sacrificial layer, so that the first sacrificial layer and the second sacrificial layer are etched by solvency action of the etching solution. Therefore, the etching solution remains between the substrate and the lower thin film and between the lower thin film and the upper thin film also after the etching. If the steps of removing the first sacrificial layer and removing the second sacrificial layer are carried out by wet etching, a rinsing step for washing out the etching solution with pure water or the like and a drying step for removing the pure water or the like must be carried out, in order to remove the remaining etching solution.

When the steps of removing the first sacrificial layer and removing the second sacrificial layer are carried out by dry etching, on the other hand, reactive gas (etching gas), ions, radicals etc. are supplied to the first sacrificial layer and the second sacrificial layer, so that the first sacrificial layer and the second sacrificial layer are etched by chemical reaction therewith. A product resulting from the chemical reaction is gas when the first sacrificial layer and the second sacrificial layer are dry-etched, whereby the rinsing step and the drying step can be omitted after the etching. Therefore, the time and labor required for manufacturing the MEMS sensor can be further reduced as compared with the case of removing the first sacrificial layer and the second sacrificial layer by wet etching.

In the MEMS sensor manufacturing method, the step of forming the lower thin film may include the steps of forming a first insulating layer on the first sacrificial layer, forming a lower electrode on the first insulating layer, forming a second insulating layer on a region of the first insulating layer including the lower electrode, and forming the lower through-holes passing through the first insulating layer from the second insulating layer.

In the MEMS sensor manufacturing method, the step of forming the lower electrode may include a step of forming the lower electrode meshed in plan view, the step of forming the second insulating layer may include a step of forming the second insulating layer having recesses between adjacent protrusions by protruding the material for the second insulating layer on the meshed lower electrode, and the step of forming the lower through-holes may be a step of forming the lower through-holes extending toward the first sacrificial layer from the bottom surfaces of the recesses.

In the MEMS sensor manufacturing method, the step of forming the upper thin film may include the steps of forming a third insulating layer on the second sacrificial layer, forming an upper electrode on the third insulating layer, forming a fourth insulating layer on a region of the third insulating layer including the upper electrode, and forming the upper through-holes passing through the third insulating layer from the fourth insulating layer.

In the MEMS manufacturing method, the step of forming the second sacrificial layer may include a step of forming the second sacrificial layer having recesses formed on positions opposed to the recesses of the second insulating layer by the material for the second sacrificial layer entering the recesses of the second insulating layer, and the step of forming the third insulating layer may include a step of forming the third insulating layer having protrusions formed by the material for the third insulating layer entering the recesses of the second sacrificial layer.

The foregoing and other objects, features and effects of the present invention will become more apparent from the following detailed description of the embodiments with reference to the attached drawings.

BRIEF DESCRIPTION OF THE DRAWINGS

FIG. 2B A sectional view showing a step subsequent to FIG. 2A.

FIG. 2C A sectional view showing a step subsequent to FIG. 2B.

FIG. 3A A schematic sectional view showing a manufacturing method for a conventional Si microphone in step order.

FIG. 3B A sectional view showing a step subsequent to FIG. 3A.

FIG. 3C A sectional view showing a step subsequent to FIG. 3B.

FIG. 3H A sectional view showing a step subsequent to FIG. 3G.

DESCRIPTION OF THE REFERENCE NUMERALS

1 . . . Si microphone, 2 . . . Si substrate, 3 . . . sensor portion, 4 . . . pad portion, 5 . . . lower thin film, 6 . . . upper thin film, 7 . . . lower thin film insulating layer, 8 . . . lower electrode, 11 . . . recess, 12 . . . lower through-hole, 13 . . . upper thin film insulating layer, 14 . . . upper electrode, 15 . . . third insulating layer, 17 . . . projection, . . . 18 . . . upper through-hole, 19 . . . cavity, 20 . . . cavity, 29 . . . upper surface, 30 . . . lower sacrificial layer, 34 . . . upper sacrificial layer, 35 . . . recess, 40 . . . recess, 91 . . . upper surface, 92 . . . lower surface, 94 . . . lower surface, L1 . . . interval, L2 . . . interval, W1 . . . Si wafer

BEST MODE FOR CARRYING OUT THE INVENTION

Figure 1:
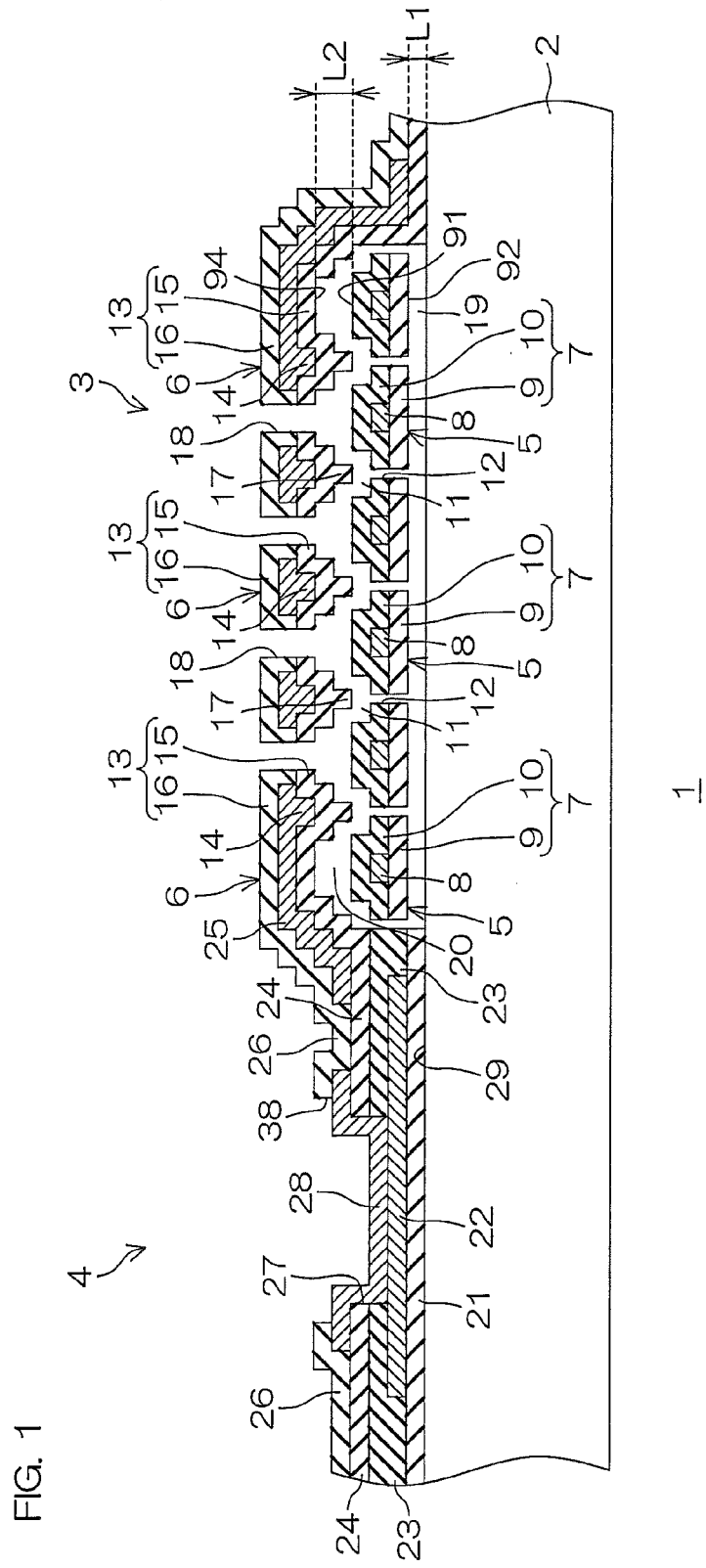
FIG. 1 A schematic sectional view of a Si microphone according to an embodiment of the present invention.

FIG. 1 is a schematic sectional view of an Si microphone according to an embodiment of the present invention.

An Si microphone 1 is a capacitance type sensor (an MEMS sensor) operating by detecting a change in a capacitance. The Si microphone 1 has a sensor portion 3 and a pad portion 4 on an Si substrate 2.

The sensor portion 3 is a portion sensing an input sound pressure and outputting a change in a capacitance responsive to the magnitude of the sound pressure to a wire 22 (described later) as an electric signal in the Si microphone 1.

The sensor portion 3 includes a lower thin film 5 opposed to one surface (the surface is hereinafter referred to as an upper surface 29) of the Si substrate 2 at an interval and an upper thin film 6 arranged above the lower thin film to be opposed to the lower thin film 5 at an interval.

The lower thin film 5 includes a lower thin film insulating layer 7 and a lower electrode 8 covered with the lower thin film insulating layer 7.

The lower thin film insulating layer 7 includes a first insulating layer 9 defining a lower layer of the lower thin film insulating layer 7 and a second insulating layer 10 formed on the first insulating layer 9 to define an upper layer of the lower thin film insulating layer 7.

The first insulating layer 9 is formed integrally with a first insulating layer 21 (described later) of the pad portion 4.

The second insulating layer 10 is formed integrally with a second insulating layer 23 (described later) of the pad portion 4. A plurality of recesses 11 are formed in the second insulating layer 10. The plurality of recesses 11 are arranged in the form of an m by n matrix (m and n: natural numbers) as a whole, for example.

The lower thin film insulating layer 7 is provided with lower through-holes 12 passing through the lower thin film insulating layer 7 in the thickness direction of the lower thin film insulating layer 7 from the bottom surfaces of the respective recesses 11. Thus, the lower thin film insulating layer 7 is in the form of a rectangular mesh in plan view provided with the lower through-holes 12 in the form of a matrix in plan view.

The lower electrode 8 is made of a conductive material such as Au or Al, for example, and Al is applied in the embodiment. The lower electrode 8 is in the form of a rectangular mesh in plan view. The lower electrode 8 is arranged on the upper surface of the first insulating layer 9. The side surfaces and the upper surface of the lower electrode 8 are covered with the second insulating layer 10. In other words, the lower electrode 8 is held between the lower first insulating layer 9 and the upper second insulating layer 10 in the lower thin film 5, so that the overall surfaces thereof are covered with the lower thin film insulating layer 7.

The second insulating layer 10 is formed on the meshed lower electrode 8, whereby the surface of the second insulating layer 10 swells on portions opposed to the lower electrode 8, and has the recesses 11 on portions not opposed to the lower electrode 8. The lower electrode 8 is supported by the wire 22 (described later) on an unshown position at a prescribed interval from the upper surface 29 of the Si substrate 2. Thus, the lower thin film 5 formed by covering the lower electrode 8 with the lower thin film insulating layer 7 is opposed to the Si substrate 2 through a cavity 19 of a small interval L1 (the distance between the upper surface 29 of the Si substrate 2 and a lower surface 92 of the lower thin film insulating layer (the first insulating layer 9) is 1 μm, for example).

The upper thin film 6 includes an upper thin film insulating layer 13 and upper electrode 14 covered with the upper thin film insulating layer 13.

The upper thin film insulating layer 13 includes a third insulating layer 15 defining a lower layer of the upper thin film insulating layer 13 and a fourth insulating layer 16 formed on the third insulating layer 15 to define an upper layer of the upper thin film insulating layer 13.

The third insulating layer 15 is formed integrally with a third insulating layer 24 (described later) of the pad portion 4. The third insulating layer 15 is provided with projections 17 (protrusions) protruding toward the recesses 11 (the lower through-holes 12) on portions opposed to the recesses 11 (the lower through-holes 12) in a lower surface 94 opposed to the lower thin film 5.

The fourth insulating layer 16 is formed integrally with a fourth insulating layer 26 (described later) of the pad portion 4.

The upper thin film insulating layer 13 is provided with a plurality of upper through-holes 18 passing through the upper thin film insulating layer 13 in the thickness direction thereof.

Each upper through-hole 18 is arranged on a position deviating from each lower through-hole 12 (between adjacent lower through-holes 12 in plan view, for example).

The upper electrode 14 is made of a conductive material such as Au or Al, for example, and Al is applied in the embodiment. The upper electrode 14 is in the form of a rectangular mesh in plan view. The upper electrode 14 is arranged on the third insulating layer 15. The side surfaces and the upper surface of the upper electrode 14 are covered with the fourth insulating layer 16. In other words, the upper electrode 14 is held between the lower third insulating layer 15 and the upper fourth insulating layer 16 in the upper thin film 6, so that the overall surfaces thereof are covered with the upper thin film insulating layer 13. The upper electrode 14 is supported by a wire 25 (described later) at a prescribed interval from the upper surface of the lower thin film 5 (an upper surface 91 of the second insulating layer 10). Thus, the upper thin film 6 formed by covering the upper electrode 14 with the upper thin film insulating layer 13 is opposed to the lower thin film 5 through a cavity 20 of a small interval L2 (the distance between the upper surface 91 of the second insulating layer 10 and the lower surface 94 of the upper thin film insulating layer 13 (the third insulating layer 15) is 4 μm, for example).

The upper thin film 6 is opposed to the lower thin film 5 through the cavity 20 of the small interval L2, and forms a capacitor whose capacitance changes by vibration along with the lower thin film 5. In other words, when a sound pressure (a sound wave) is input in the sensor portion 3, the upper thin film 6 and/or the lower thin film 5 vibrates due to the sound pressure, and an electric signal responsive to a change in the capacitance of the capacitor resulting from the vibration of the upper thin film 6 and/or the lower thin film 5 is output to the wire 22 (described later).

The pad portion 4 is a portion outputting the electric signal output from the sensor portion 3 to an external wire.

The pad portion 4 includes the first insulating layer 21, the wire 22, the second insulating layer 23, the third insulating layer 24, the wire 25, and the fourth insulating layer 26.

The first insulating layer 21 is formed on the upper surface 29 of the Si substrate 2.

The wire 22 is formed on the first insulating layer 21 in a prescribed pattern. The wire 22 is formed integrally with the lower electrode 8 on the unshown position, and electrically connected with the wire 25.

The second insulating layer 23 is formed on the first insulating layer 21, and covers the wire 22 along with the first insulating layer 21.

The third insulating layer 24 is formed on the second insulating layer 23.

The wire 25 is formed on the third insulating layer 24 in a prescribed pattern. The wire 25 is formed integrally with the upper electrode 14, and electrically connected with the wire 22 on an unshown position.

The second insulating layer 23 and the third insulating layer 24 are provided with an opening 27 passing through these layers in the thickness direction thereof. The opening 27 is employed for partially exposing the wire 22 as a bonding pad.

A metallic thin film 28 covering the wire 22 exposed from the opening 27 is formed on the opening 27. The metallic thin film 28 is made of a conductive material such as Au or Al, for example, and Al is applied in the embodiment. An electric wire (not shown) for electrically connecting an external IC chip (not shown) for processing the electric signal and the Si microphone 1 with each other is connected to the metallic thin film 28, for example.

The fourth insulating layer 26 is formed on the third insulating layer 24. An opening 38 partially exposing the metallic thin film 28 is formed in the fourth insulating layer 26.

FIGS. 2A to 2H are schematic sectional views showing a manufacturing method for the Si microphone of FIG. 1 in step order.

Figure 2A:
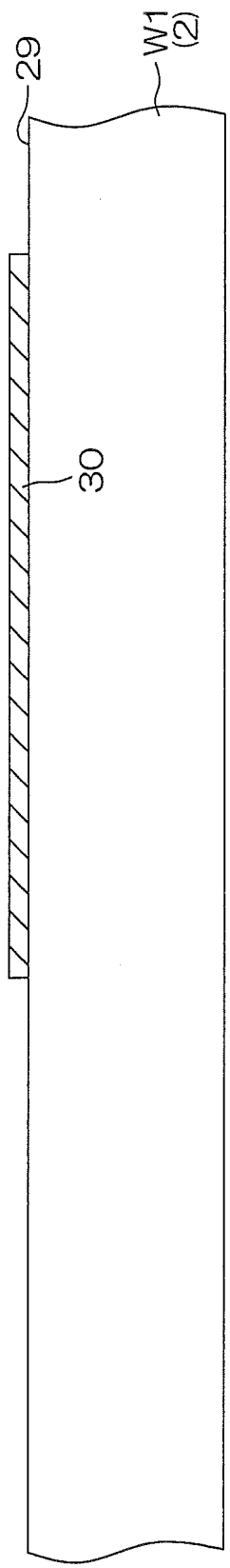
FIG. 2A A schematic sectional view showing a manufacturing method for the Si microphone of FIG. 1 in step order.

In order to manufacture the Si microphone 1, Al (aluminum) is deposited on one surface (the upper surface 29) of a discoidal Si wafer W1 forming the matrix of the Si substrate 2 by PECVD (Plasma Enhanced Chemical Vapor Deposition), for example. Then, the Al is patterned by well-known photolithography and etching, and a lower sacrificial layer 30 made of Al is formed, as shown in FIG. 2A (a step of forming a first sacrificial layer).

Then, a first insulating layer 31 made of $SiO_2$ is formed on the overall region of the Si wafer W1 including the lower sacrificial layer 30 by PECVD, for example. Then, an Al film is formed on the overall region of the first insulating layer 31 by sputtering, for example. Then, the Al film is patterned by well-known photolithography and etching. Thus, the lower electrode 8 meshed in plan view is formed on a position of the upper surface of the first insulating layer 31 opposed to the Si wafer W1 through the lower sacrificial layer 30, as shown in FIG. 2B. On the other hand, the wire 22 of a prescribed pattern is formed on a portion of the first insulating layer 31 directly formed on the upper surface 29 of the Si wafer W1.

Then, a second insulating layer 32 is formed on the overall region of the first insulating layer 31 including the wire 22 and the lower electrode 8 by PECVD, for example. At this time, portions of the second insulating layer 32 (the second insulating layer 10) on the lower electrode 8 protrude by the thickness of the lower electrode 8, whereby the recesses 11 are formed between adjacent protruding portions.

Then, the second insulating layer 32 and the first insulating layer 31 are patterned by well-known photolithography and etching, and the lower through-holes 12 extending toward the lower sacrificial layer 30 from the bottom surfaces of the recesses 11 in the thickness direction are formed. Thus, a portion of the first insulating layer 31 on the lower sacrificial layer 30 becomes the first insulating layer 9, and a portion of the second insulating layer 32 on the first insulating layer 9 becomes the second insulating layer 10. Thus, the lower thin film 5 constituted by covering the lower electrode 8 with the lower thin film insulating layer 7 consisting of the first insulating layer 9 and the second insulating layer 10 is formed on the lower sacrificial layer 30, as shown in FIG. 2C (a step of forming a lower thin film).

On the other hand, a portion of the first insulating layer 31 directly formed on the upper surface 29 of the Si wafer W1 becomes the first insulating layer 21, and a portion of the second insulating layer 32 on the first insulating layer 21 becomes the second insulating layer 23 covering the wire 22 along with the first insulating layer 21.

Figure 2D:
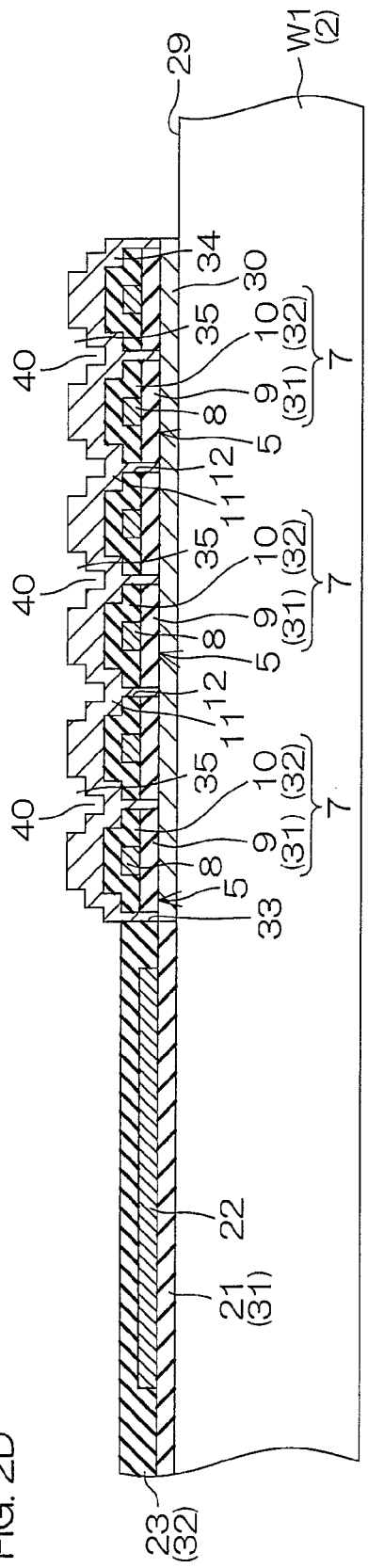
FIG. 2D A sectional view showing a step subsequent to FIG. 2C.

Then, Al is deposited on the overall region of the Si wafer W1 by PECVD, for example. The Al is deposited up to a height for filling up a clearance 33 between the lower through-holes 21 as well as the lower thin film insulating layer 7 and the second insulating layer 23 and completely covering the lower thin film 5. Then, the Al is patterned by well-known photolithography and etching. Thus, an upper sacrificial layer 34 made of Al is formed, as shown in FIG. 2D (a step of forming a second sacrificial layer). At this time, the recesses 11 are formed in the second insulating layer 10 of the lower thin film 5, whereby recesses 35 are formed in the upper sacrificial layer 34 on positions opposed to the recesses 11. Further, the lower through-holes 12 are formed in the lower thin film insulating layer 7, whereby recesses 40 further depressed by one stage from the bottom surfaces of the recesses 35 are formed in the upper sacrificial layer 34.

Figure 2E:
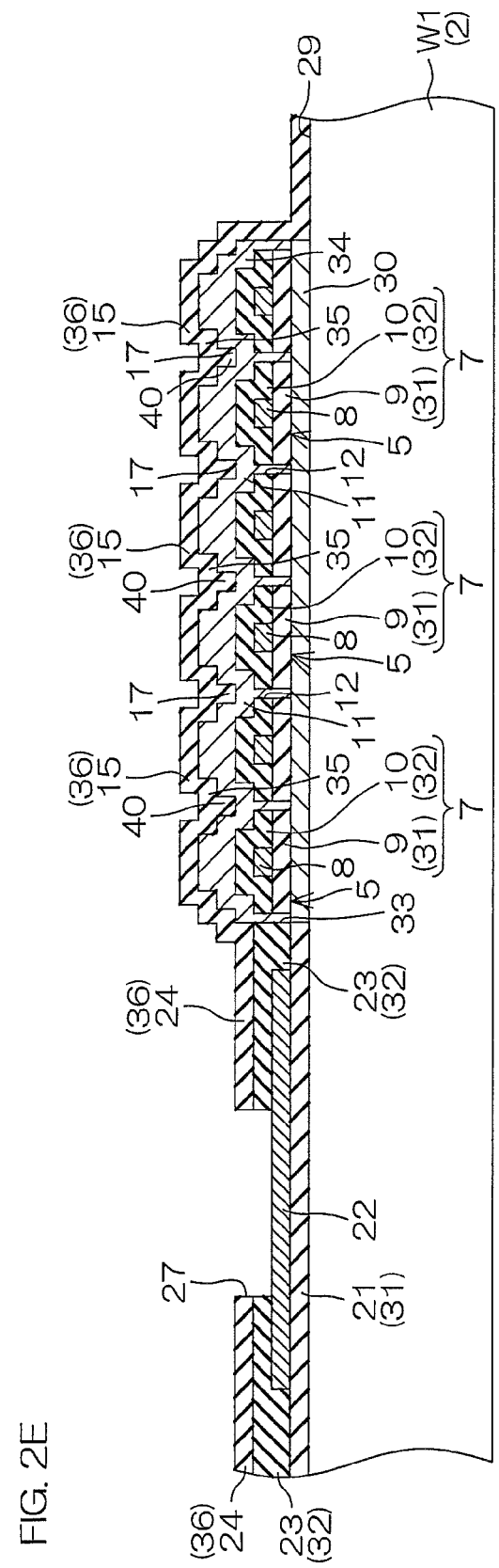
FIG. 2E A sectional view showing a step subsequent to FIG. 2D.

After the upper sacrificial layer 34 is formed, SiO$_2$ is deposited on the overall region of the Si wafer W1 including the upper sacrificial layer 34 by PECVD, for example. The SiO$_2$ is deposited up to a height for entering the recesses 40 and the recesses 35 and completely covering the upper sacrificial layer 34. Thus, a third insulating layer 36 consisting of the third insulating layer 15 on the upper sacrificial layer 34 and the third insulating layer 24 on the second insulating layer 23 is formed, as shown in FIG. 2E. Thereafter the third insulating layer 24 and the second insulating layer 23 are partially removed by well-known photolithography and etching, and the opening 27 partially exposing the wire 22 as a bonding pad is formed.

Figure 2F:
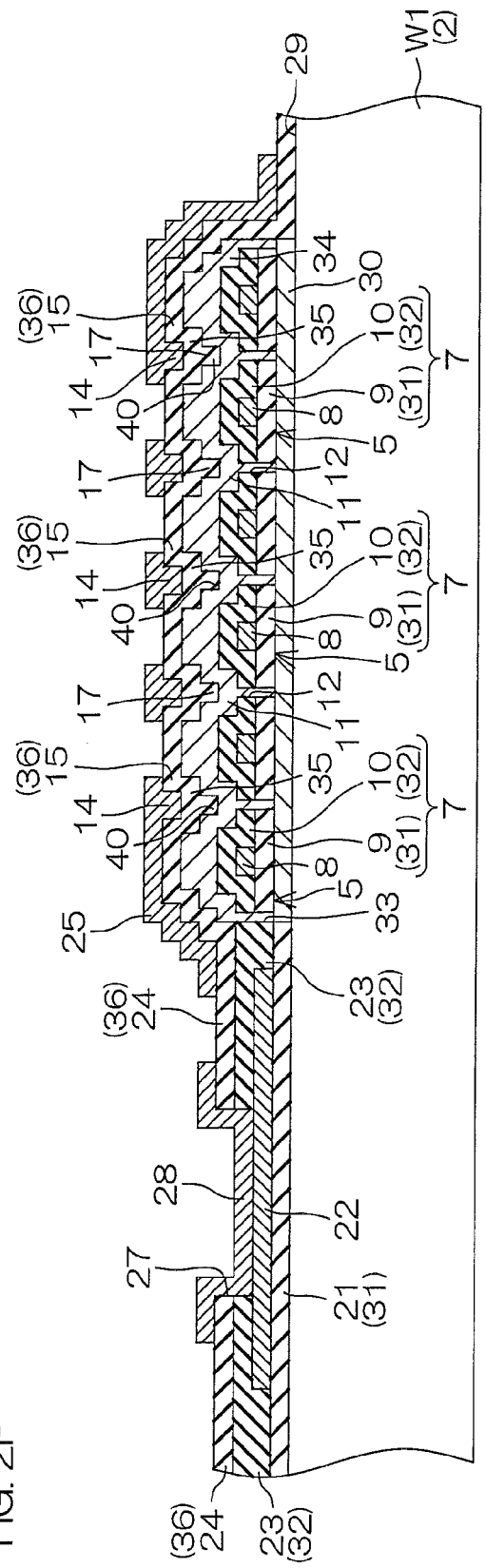
FIG. 2F A sectional view showing a step subsequent to FIG. 2E.

Then, an Al film is formed on the overall region of the third insulating layer 36 by sputtering, for example. Then, the Al film is patterned by well-known photolithography and etching. Thus, the upper electrode 14 meshed in plan view is formed on a position of the upper surface of the third insulating layer 15 opposed to the lower thin film 5 through the upper sacrificial layer 34, as shown in FIG. 2F. On the other hand, the wire 25 of a prescribed pattern is formed on the upper surface of the third insulating layer 24. Further, the metallic thin film 28 covering the wire 22 exposed from the opening 27 is formed on the opening 27.

Figure 2G:
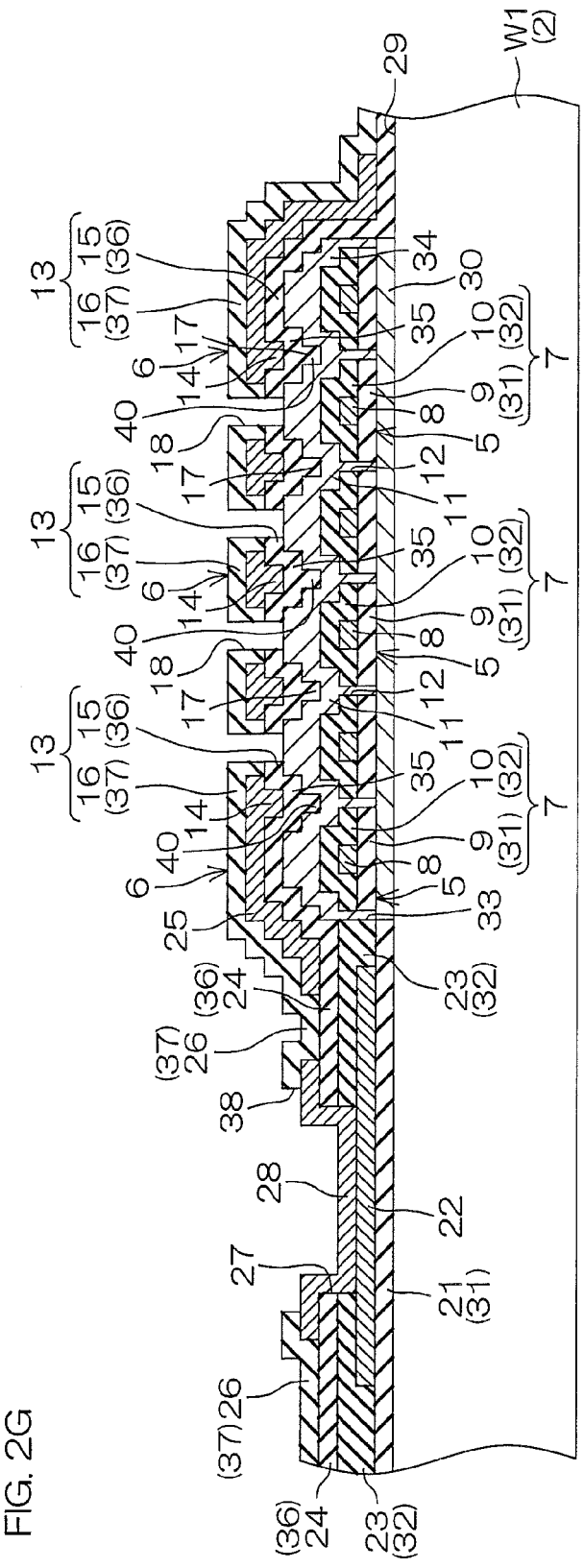
FIG. 2G A sectional view showing a step subsequent to FIG. 2F.

Then, SiO$_2$ is deposited on the overall region of the third insulating layer 36 including the upper electrode 14, the wire 25 and the metallic thin film 28 by PECVD, for example. Thus, a fourth insulating layer 37 consisting of the fourth insulating layer 16 on the third insulating layer 15 and the fourth insulating layer 26 on the third insulating layer 24 is formed. Then, the fourth insulating layer 37 and the third insulating layer 36 are patterned by well-known photolithography and etching. Thus, the fourth insulating layer 16 and the third insulating layer 15 are provided with upper through-holes 18, extending toward the upper sacrificial layer 34 in the thickness direction thereof, arranged on the positions deviating from the lower through-holes 12, as shown in FIG. 2G. Thus, the upper thin film 6 constituted by covering the upper electrode 14 with the upper thin film insulating layer 13 consisting of the third insulating layer 15 and the fourth insulating layer 16 is formed on the lower thin film 5 (a step of forming an upper thin film). Further, the opening 38 exposing the metallic thin film 28 is formed in the fourth insulating layer 26.

Figure 2H:
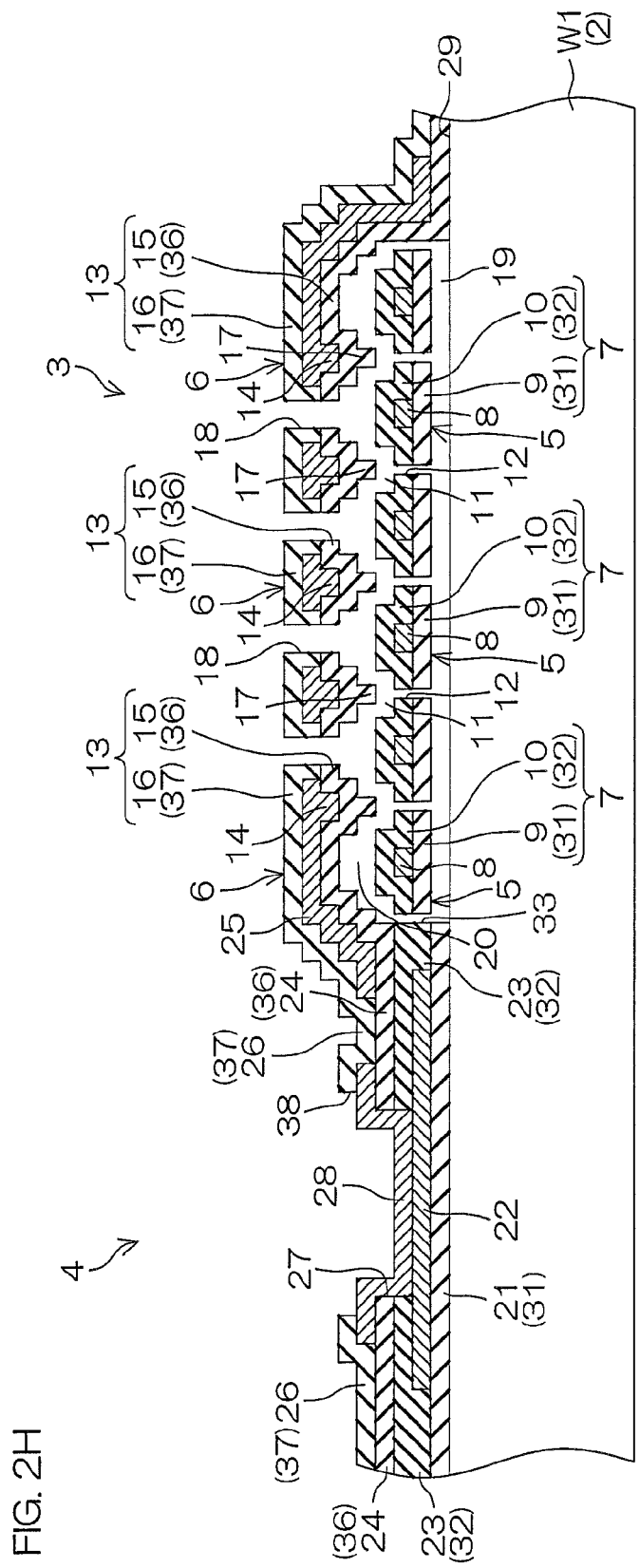
FIG. 2H A sectional view showing a step subsequent to FIG. 2G.
Figure 3D:
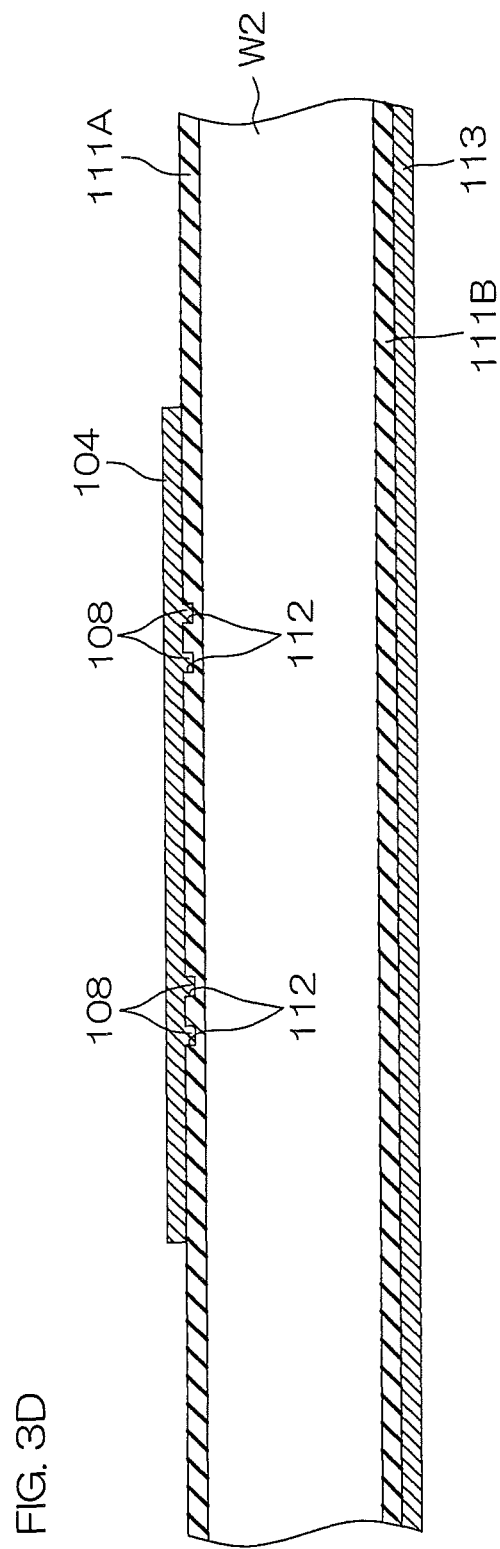
FIG. 3D A sectional view showing a step subsequent to FIG. 3C.
Figure 3E:
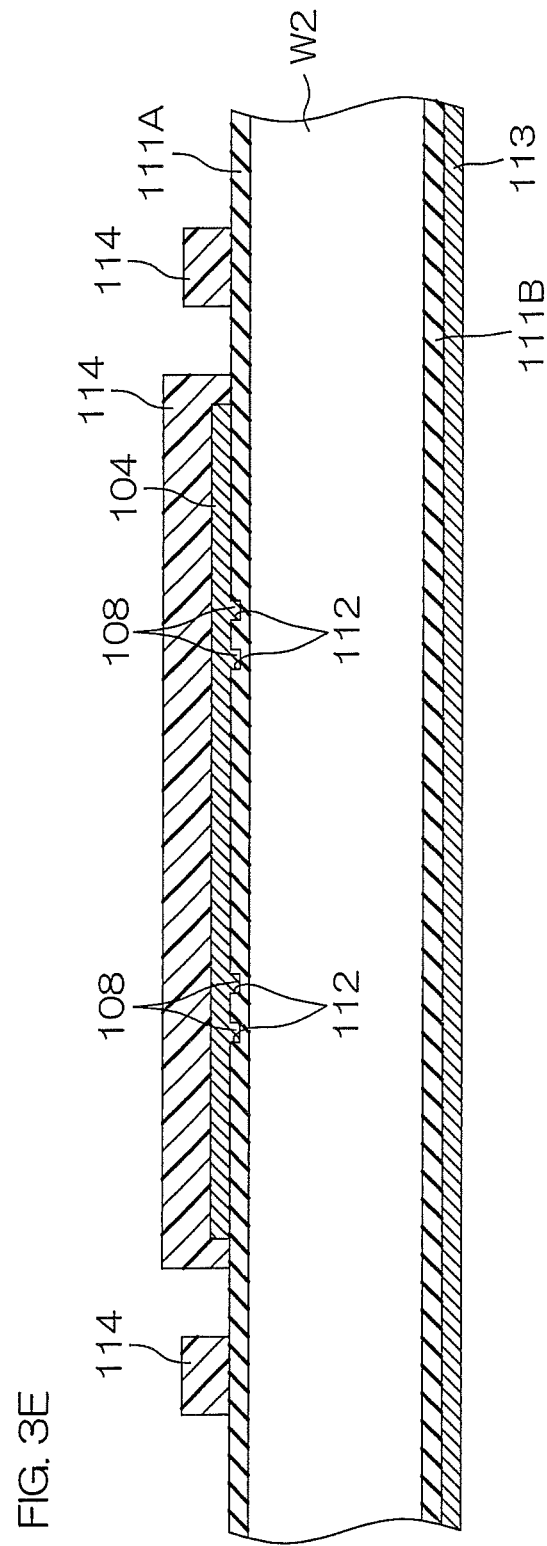
FIG. 3E A sectional view showing a step subsequent to FIG. 3D.
Figure 3F:
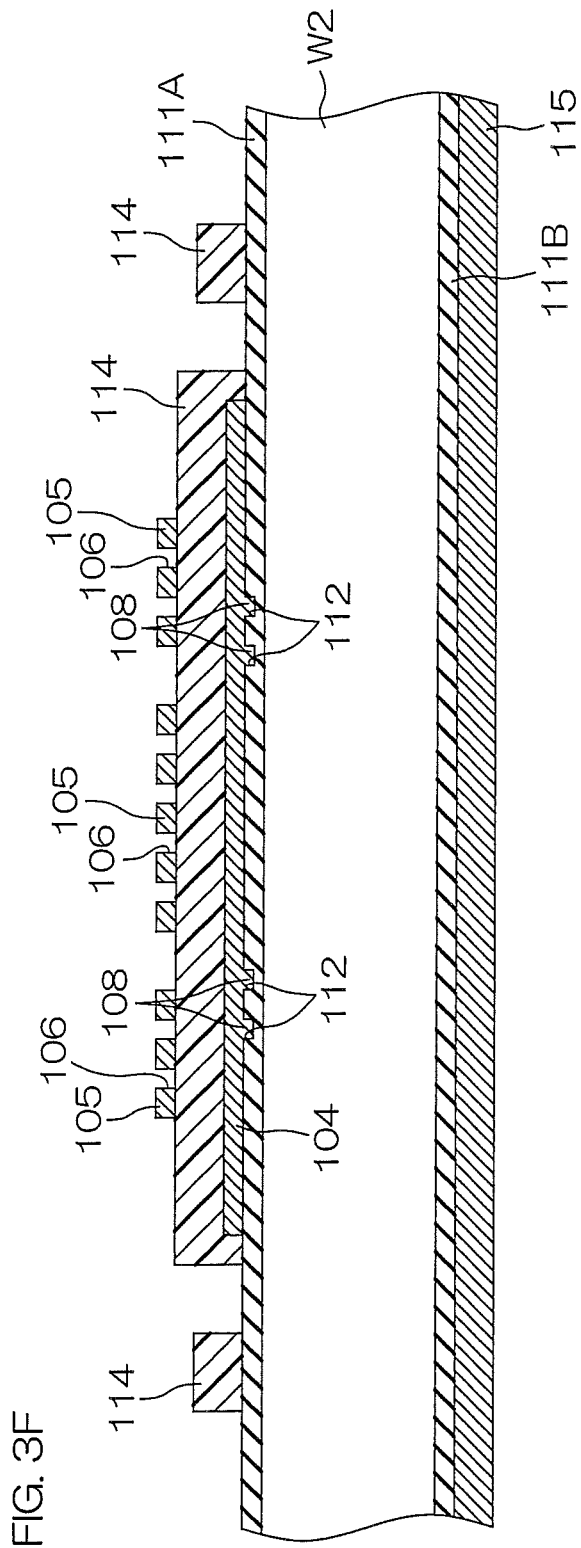
FIG. 3F A sectional view showing a step subsequent to FIG. 3E.
Figure 3G:
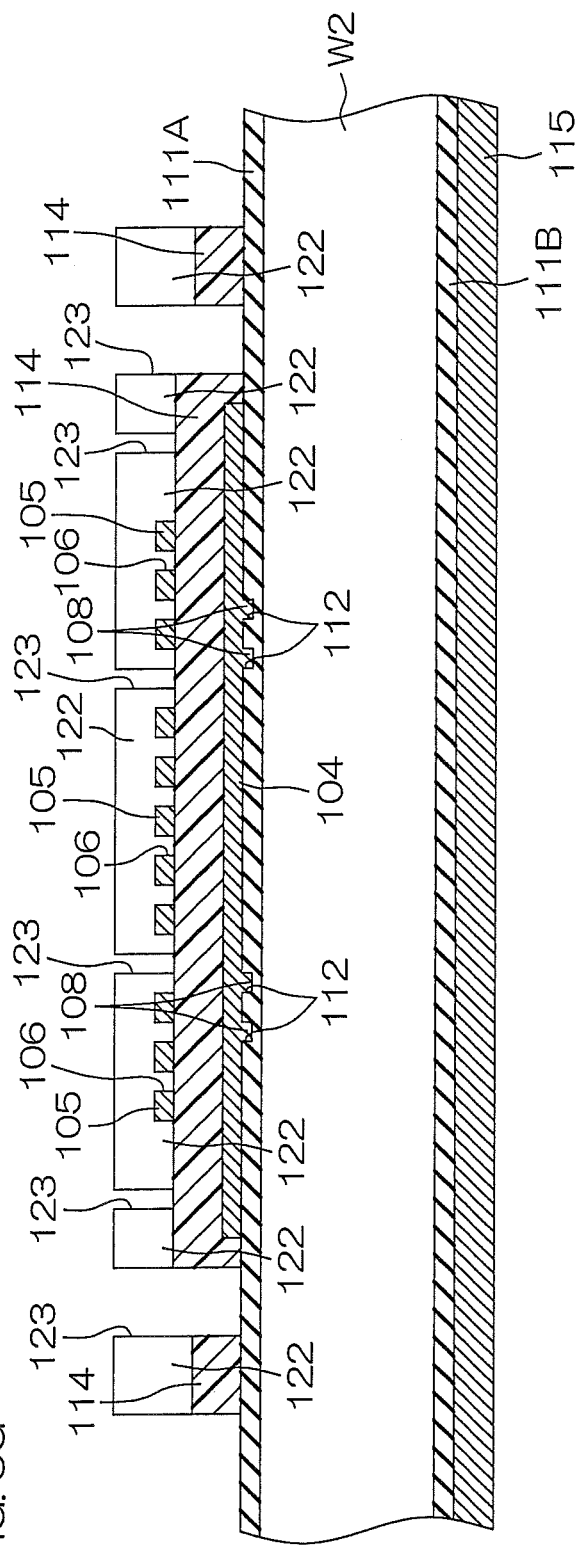
FIG. 3G A sectional view showing a step subsequent to FIG. 3F.
Figure 3I:
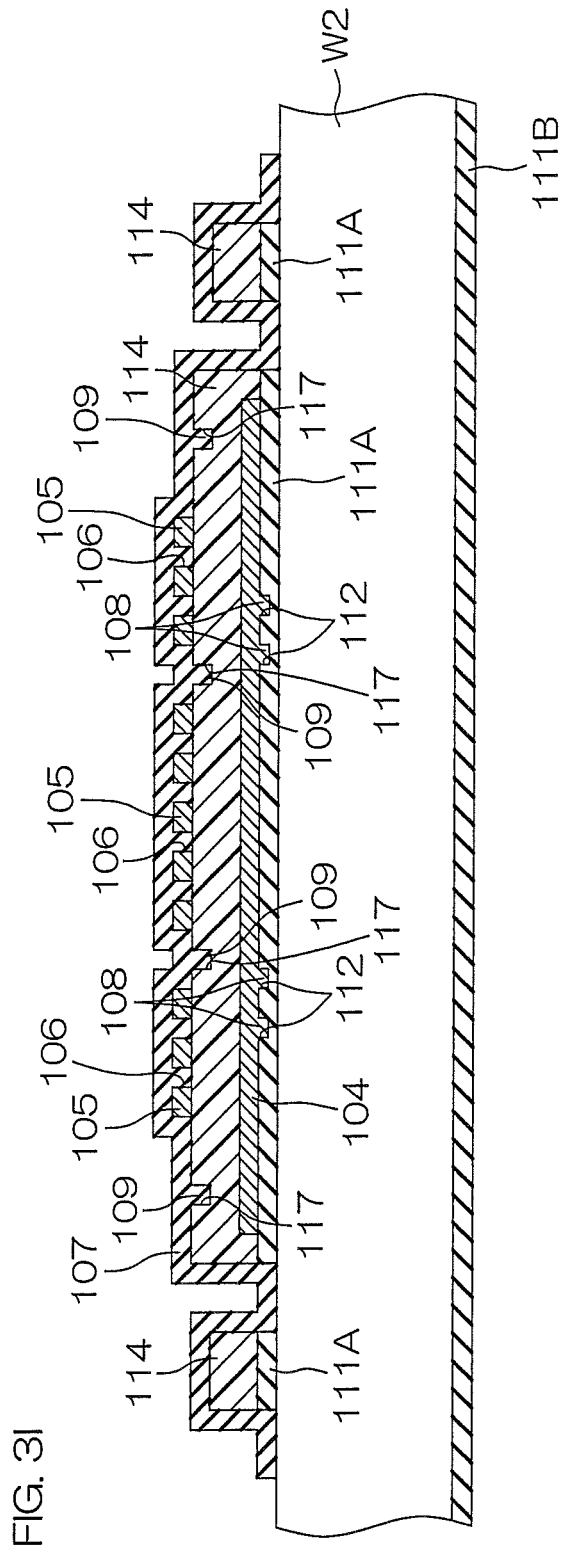
FIG. 3I A sectional view showing a step subsequent to FIG. 3H.
Figure 3J:
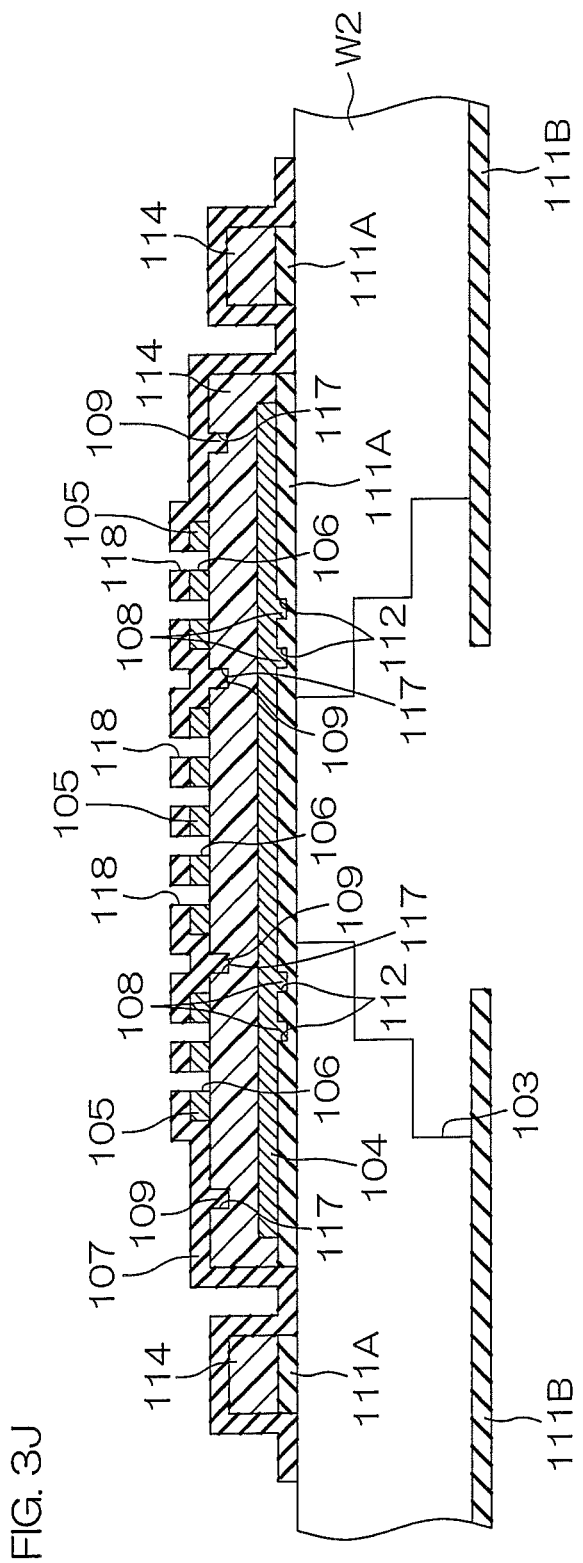
FIG. 3J A sectional view showing a step subsequent to FIG. 3I.
Figure 3K:
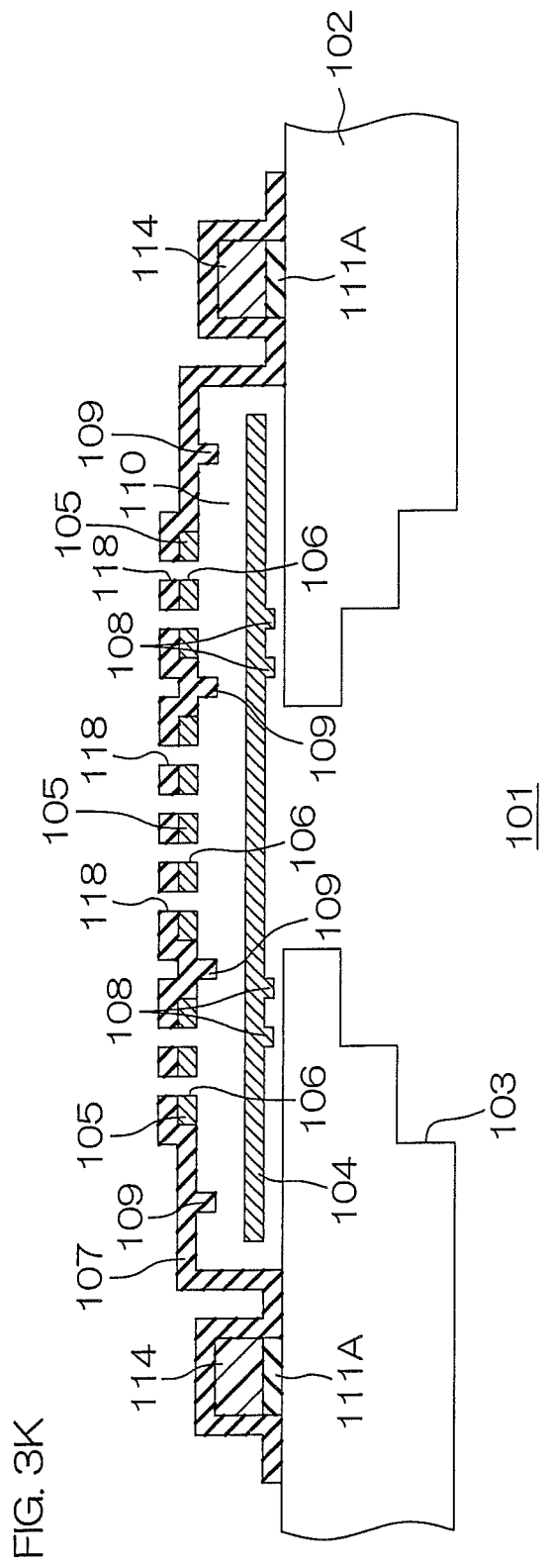
FIG. 3K A sectional view showing a step subsequent to FIG. 3J.

Thereafter etching gas (chlorine-based gas such as BCl$_3$ (boron trichloride), for example, or fluorine-based gas such as CF$_4$ (carbon tetrafluoride), for example) is supplied to the upper sacrificial layer 34 through the upper through-holes 18, and the upper sacrificial layer 34 is dry-etched (a step of removing the second sacrificial layer). Thus, the upper sacrificial layer 34 is removed, and the cavity 20 is formed between the lower thin film 5 and the upper thin film 6, as shown in FIG. 2H.

Then, etching gas is supplied to the lower sacrificial layer 30 through the upper through-holes 18, the cavity 20 and the lower through-holes 12, and the lower sacrificial layer 30 is dry-etched. Thus, the lower sacrificial layer 30 is removed, and the cavity 19 is formed between the Si wafer W1 and the lower thin film 5, as shown in FIG. 2H (a step of removing the first sacrificial layer).

The Si wafer W1 is divided into the size of the Si substrate 2, whereby the Si microphone 1 shown in FIG. 1 is obtained. The portions of the third insulating layer 15 having entered the respective recesses 35 and 40 of the upper sacrificial layer 34 become the projections 17 protruding toward the recesses 11 (the lower through-holes 12), and function as stoppers suppressing maintenance of contact (adhesion) between the upper thin film 6 and the lower thin film 5. According to the embodiment, as hereinabove described, the lower sacrificial layer 30 is formed on the upper surface 29 of the Si wafer W1, and the lower thin film 5 having the plurality of recesses 11 and the plurality of lower through-holes 12 in the form of matrices is formed on the lower sacrificial layer 30. Further, the upper sacrificial layer 34 is formed on the lower thin film 5, and the upper thin film 6 having the plurality of upper through-holes 18 in the form of a matrix communicating with the lower through-holes 12 is formed on the upper sacrificial layer 34. The upper sacrificial layer 34 is removed by the dry etching through the upper through-holes 18. The lower sacrificial layer 30 is removed by the dry etching through the upper through-holes 18 and the lower through-holes 12 after the removal of the upper sacrificial layer 34.

The lower thin film 5 has the plurality of lower through-holes 12 in the form of a matrix, whereby the etching gas can be promptly supplied to the lower sacrificial layer 30 under the lower thin film 5 through the lower through-holes 12. Therefore, the lower sacrificial layer 30 can be removed in a short time without forming a through-hole exposing the lower sacrificial layer 30 from another surface of the Si substrate 2 and supplying the etching gas to the lower sacrificial layer 30 through the through-hole. Consequently, the time and labor required for manufacturing the Si microphone 1 can be reduced.

Both of the lower sacrificial layer 30 and the upper sacrificial layer 34 are made of Al (aluminum), whereby the lower sacrificial layer 30 can be removed subsequently to the removal of the upper sacrificial layer 34 in a series of steps. Consequently, the time and labor required for manufacturing the Si microphone 1 can be further reduced.

According to the embodiment, further, the lower sacrificial layer 30 and the upper sacrificial layer 34 are removed by the dry etching.

If the lower sacrificial layer 30 and the upper sacrificial layer 34 are removed by wet etching, for example, an etching solution is supplied to the lower sacrificial layer 30 and the upper sacrificial layer 34, so that the lower sacrificial layer 30 and the upper sacrificial layer 34 are etched by solvency action of the etching solution. Therefore, the etching solution remains between the Si substrate 2 and the lower thin film 5 and between the lower thin film 5 and the upper thin film 6 also after the etching. If the lower sacrificial layer 30 and the upper sacrificial layer 34 are removed by wet etching, a rinsing step for washing out the etching solution with pure water or the like and a drying step for removing the pure water or the like must be carried out, in order to remove the remaining etching solution.

When the lower sacrificial layer 30 and the upper sacrificial layer 34 are removed by dry etching, on the other hand, reactive gas (etching gas), ions, radicals etc. are supplied to the lower sacrificial layer 30 and the upper sacrificial layer 34, so that the lower sacrificial layer 30 and the upper sacrificial layer 34 are etched by chemical reaction therewith. A product resulting from the chemical reaction is gas when the lower sacrificial layer 30 and the upper sacrificial layer 34 are dry-etched, whereby the rinsing step and the drying step can be omitted after the etching. Therefore, the time and labor required for manufacturing the Si microphone 1 can be further reduced as compared with the case of removing the lower sacrificial layer 30 and the upper sacrificial layer 34 by wet etching.

According to the embodiment, each upper through-hole 18 and each lower through-hole 12 are arranged on deviating positions (between adjacent lower through-holes 12 in plan view, for example) in plan view.

If each upper through-hole 18 and each lower through-hole 12 are arranged on the same position in plan view, for example, the etching gas supplied from the upper through-hole 18 is hard to supply to a portion of the upper sacrificial layer 34 not opposed to the upper through-hole 18 and the lower through-hole 12. Therefore, the upper sacrificial layer 34 may remain on the portion unless the time for supplying the etching gas is set sufficiently long.

According to the embodiment, on the other hand, each upper through-hole 18 and each lower through-hole 12 are arranged on deviating positions in plan view. According to the structure, the etching gas supplied from the upper through-hole 18 spreads toward the lower through-hole 12 after the removal of the upper sacrificial layer 34 through the cavity 20 resulting from the removal of the upper sacrificial layer 34. Therefore, the upper sacrificial layer 34 and the lower sacrificial layer 30 can be removed without leaving the upper sacrificial layer 34 between the upper thin film 6 and the lower thin film 5. Consequently, the time and labor required for manufacturing the Si microphone 1 can be further reduced as compared with the case where each through-hole 18 and each lower through-hole 12 are arranged on the same position in plan view.

The lower thin film 5 has the plurality of recesses 11 and the plurality of lower through-holes 12 in the form of matrices, whereby aluminum employed as the material for the upper sacrificial layer 34 enters the lower through-holes 12 and the recesses 11 when the upper sacrificial layer 34 is formed. Therefore, the recesses 35 and 40 are formed in the upper sacrificial layer 34 on the positions opposed to the recesses 11 (the lower through-holes 12). The recesses 35 and 40 are so formed in the upper sacrificial layer 34 that the third insulating layer 15 formed on the upper sacrificial layer 34 partially enter the recesses 35 and 40, and the portions entering the recesses 35 and 40 become the projections 17 protruding toward the recesses 11 (the lower through-holes 12) after the formation of the cavity 20 by the removal of the upper sacrificial layer 34.

Thus, according to the embodiment, the recesses 35 and 40 utilized for the formation of the projections 17 can be formed in the upper sacrificial layer 34 without carrying out a step of forming a photoresist film having a plurality of holes on the upper sacrificial layer 34 and a step of forming recesses corresponding to the recesses 35 and 40 in the upper sacrificial layer 34 by etching through the photoresist film serving as a mask. Consequently, the time and labor required for forming the projections 17 can be reduced.

The projections 17 formed on the upper thin film 6 (the third insulating layer 15) function as the stoppers suppressing maintenance of contact (adhesion) between the upper thin film 6 and the lower thin film 5. Therefore, the cavity 20 between the upper thin film 6 and the lower tin film 5 can be maintained. Consequently, the sound pressure can be correctly detected, whereby a microphone operation (a sensor operation) of the Si microphone 1 can be excellently performed.

While the embodiment of the present invention has been described, the present invention may be embodied in other ways.

For example, the upper sacrificial layer 34 and the lower sacrificial layer 30 may be made of SiN (silicon nitride), for example, so far as the same is an etchable substance and a substance having an etching selection ratio with respect to the lower thin film insulating layer 7 and the upper thin film insulating layer 13.

The lower thin film insulating layer 7 and the upper thin film insulating layer 13 may be made of SiN or the like, so far as the same is an insulating material. When the lower thin film insulating layer 7 and the upper thin film insulating layer 13 are made of a material other than $SiO_2$, the upper sacrificial layer 34 and the lower sacrificial layer 30 may be made of $SiO_2$.

While the Si microphone 1 has been employed as an example of a capacitance type sensor in the aforementioned embodiment, the present invention is not restricted to this, but may be applied to a pressure sensor or an acceleration sensor operating by detecting a change in a capacitance.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-192201, Japanese Patent Application No.

2007-192205 and Japanese Patent Application No. 2007-192206 filed with the Japan Patent Office on Jul. 24, 2007, the disclosures of which are incorporated herein by reference.

INDUSTRIAL APPLICABILITY

The MEMS sensor and the MEMS sensor manufacturing method according to the present invention are preferably applied to various devices (an Si microphone, a pressure sensor, an acceleration sensor, a gyro sensor and the like) manufactured by the MEMS technique.

The invention claimed is:

1. An MEMS sensor comprising:
a substrate;
a lower thin film opposed to one surface of the substrate at an interval and provided with a plurality of lower through-holes in the form of a matrix formed to pass through the same in the thickness direction thereof; and
an upper thin film opposed to the lower thin film at an interval on a side opposite to the substrate and provided with a plurality of upper through-holes formed to pass through the same in the thickness direction thereof;
all of the plurality of upper through-holes being positioned deviating from the lower through-holes, in plan view, respectively; and
protrusions being formed integrally with the upper thin film to protrude toward the lower through-holes from a surface of the upper thin film opposed to the lower thin film.

2. An MEMS sensor comprising:
a substrate;
a lower thin film opposed to one surface of the substrate at an interval and provided with a plurality of lower through-holes in the form of a matrix formed to pass through the same in the thickness direction thereof; and
an upper thin film opposed to the lower thin film at an interval on a side opposite to the substrate and provided with a plurality of upper through-holes formed to pass through the same in the thickness direction thereof;
all of the plurality of upper through-holes being positioned deviating from the lower through-holes, in plan view, respectively; and
wherein the lower thin film includes a lower thin film insulating layer and a lower electrode covered with the lower thin film insulating layer.

3. The MEMS sensor according to claim 2, wherein
the lower thin film insulating layer includes a first insulating layer defining a lower layer and a second insulating layer defining an upper layer formed on the first insulating layer, and
the lower electrode is held between the first insulating layer and the second insulating layer, so that the overall surface thereof is covered with the lower thin film insulating layer.

4. An MEMS sensor comprising:
a substrate;
a lower thin film opposed to one surface of the substrate at an interval and provided with a plurality of lower through-holes in the form of a matrix formed to pass through the same in the thickness direction thereof; and
an upper thin film opposed to the lower thin film at an interval on a side opposite to the substrate and provided with a plurality of upper through-holes formed to pass through the same in the thickness direction thereof;
the plurality of upper through-holes being positioned deviating from the lower through-holes, in plan view, respectively;
wherein the lower thin film includes a lower thin film insulating layer and a lower electrode covered with the lower thin film insulating layer;
wherein the lower thin film insulating layer includes a first insulating layer defining a lower layer and a second insulating layer defining an upper layer formed on the first insulating layer;
wherein the lower electrode is held between the first insulating layer and the second insulating layer, so that the overall surface thereof is covered with the lower thin film insulating layer;
wherein a plurality of recesses are formed on the second insulating layer; and
wherein the lower through-holes are formed to pass through the lower thin film insulating layer from the bottom surfaces of the respective recesses.

5. The MEMS sensor according to claim 4, wherein the second insulating layer swells on portions opposed to the lower electrode, so that the recesses are formed on portions not opposed to the lower electrode.

6. An MEMS sensor comprising:
a substrate;
a lower thin film opposed to one surface of the substrate at an interval and provided with a plurality of lower through-holes in the form of a matrix formed to pass through the same in the thickness direction thereof; and
an upper thin film opposed to the lower thin film at an interval on a side opposite to the substrate and provided with a plurality of upper through-holes formed to pass through the same in the thickness direction thereof;
all of the plurality of upper through-holes being positioned deviating from the lower through-holes, in plan view, respectively;
wherein the upper thin film includes an upper thin film insulating layer and an upper electrode covered with the upper thin film insulating layer;
wherein the upper thin film insulating layer includes a third insulating layer defining a lower layer and a fourth insulating layer defining an upper layer formed on the third insulating layer, and
wherein the upper electrode is held between the third insulating layer and the fourth insulating layer, so that the overall surface thereof is covered with the upper thin film insulating layer.

7. The MEMS sensor according to claim 4, further comprising protrusions formed integrally with the upper thin film and configured to protrude toward the lower through-holes from a surface of the upper thin film opposed to the lower thin film, wherein
the upper thin film includes an upper thin film insulating layer and an upper electrode covered with the upper thin film insulating layer,
the upper thin film insulating layer includes a third insulating layer defining a lower layer and a fourth insulating layer defining an upper layer formed on the third insulating layer,
the upper electrode is held between the third insulating layer and the fourth insulating layer, so that the overall surface thereof is covered with the upper thin film insulating layer, and
the protrusions are projections formed integrally with the third insulating layer.

8. The MEMS sensor according to claim 7, wherein the projections are formed on portions opposed to the recesses.

9. An MEMS sensor comprising:
a substrate;
a lower thin film opposed to one surface of the substrate at an interval and provided with a plurality of lower through-holes formed to pass through the same in the thickness direction thereof; and
an upper thin film opposed to the lower thin film at an interval on a side opposite to the substrate and provided with a plurality of upper through-holes formed to pass through the same in the thickness direction thereof;
the lower thin film including a lower thin film insulating layer and a lower electrode covered with the lower thin film insulating layer;
the lower thin film insulating layer including a first insulating layer defining a lower layer and a second insulating layer defining an upper layer formed on the first insulating layer;
the lower electrode being held between the first insulating layer and the second insulating layer, the overall surface thereof being covered with the lower thin film insulating layer;
a plurality of recesses being formed on the second insulating layer; and
the lower through-holes being formed to pass through the lower thin film insulating layer from the bottom surfaces of the respective recesses.

10. The MEMS sensor according to claim 9, wherein the second insulating layer swells on portions opposed to the lower electrode, so that the recesses are formed on portions that are not opposed to the lower electrode.

11. The MEMS sensor according to claim 9, further comprising protrusions formed integrally with the upper thin film and configured to protrude toward the lower through-holes from a surface of the upper thin film opposed to the lower thin film, wherein:
the upper thin film includes an upper thin film insulating layer and an upper electrode covered with the upper thin film insulating layer;
the upper thin film insulating layer includes a third insulating layer defining a lower layer and a fourth insulating layer defining an upper layer formed on the third insulating layer;
the upper electrode is held between the third insulating layer and the fourth insulating layer, so that the overall surface thereof is covered with the upper thin film insulating layer; and
the protrusions are projections formed integrally with the third insulating layer and formed on portions opposed to the recesses.

12. The MEMS sensor according to claim 4, further comprising protrusions formed integrally with the upper thin film to protrude toward the lower through-holes from a surface of the upper thin film opposed to the lower thin film.

13. The MEMS sensor according to claim 9, further comprising protrusions formed integrally with the upper thin film to protrude toward the lower through-holes from a surface of the upper thin film opposed to the lower thin film.

* * * * *